(12) United States Patent
Cheong et al.

(10) Patent No.: US 9,343,599 B2
(45) Date of Patent: *May 17, 2016

(54) SOLAR CELL AND METHOD FOR MANUFACTURING THE SAME

(71) Applicant: LG ELECTRONICS INC., Seoul (KR)

(72) Inventors: Juhwa Cheong, Seoul (KR); Hyunjung Park, Seoul (KR); Junyong Ahn, Seoul (KR); Seongeun Lee, Seoul (KR); Jiweon Jeong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 129 days.

This patent is subject to a terminal disclaimer.

(21) Appl. No.: 14/146,501

(22) Filed: Jan. 2, 2014

(65) Prior Publication Data

US 2014/0116506 A1 May 1, 2014

Related U.S. Application Data

(63) Continuation of application No. 12/489,131, filed on Jun. 22, 2009, now Pat. No. 8,642,372.

(30) Foreign Application Priority Data

Aug. 29, 2008 (KR) ........................ 10-2008-0085480

(51) Int. Cl.
*H01L 31/00* (2006.01)
*H01L 31/0236* (2006.01)
(Continued)

(52) U.S. Cl.
CPC .... *H01L 31/02363* (2013.01); *H01L 31/02168* (2013.01); *H01L 31/18* (2013.01); *Y02E 10/52* (2013.01)

(58) Field of Classification Search
CPC .................. H01L 31/02168; H01L 31/02363; H01L 31/18; Y02E 10/52
USPC .............................................. 136/256; 438/71
See application file for complete search history.

(56) References Cited

U.S. PATENT DOCUMENTS 4,463,216 A  7/1984 Nakano et al.
5,080,725 A  1/1992 Green et al.
(Continued)

FOREIGN PATENT DOCUMENTS

EP   1 936 698 A1   6/2008
JP   2001-015782 A  1/2001
(Continued)

OTHER PUBLICATIONS

Schneiderlochner, E., et al. "Laser-Fired Rear Contacts for Crystalline Silicon Solar Cells", 2002, Progress in Photovoltaics: Research and Applications, 10:29-34 DOI: 10.1002/pip.422, pp. 29-34.

*Primary Examiner* — Tamir Ayad
(74) *Attorney, Agent, or Firm* — Birch, Stewart, Kolasch & Birch, LLP

(57) ABSTRACT

A method of manufacturing a solar cell includes forming jagged portions non-uniformly on a surface of a substrate, forming a first type semiconductor and a second type semiconductor in the substrate, forming a first electrode to contact the first type semiconductor, and forming a second electrode to contact the second type semiconductor. An etchant used in a wet etching process in manufacturing the solar cell includes about 0.5 wt % to 10 wt % of HF, about 30 wt % to 60 wt % of $HNO_3$, and up to about 30 wt % of acetic acid based on total weight of the etchant.

9 Claims, 9 Drawing Sheets

(51) Int. Cl.
 *H01L 31/0216* (2014.01)
 *H01L 31/18* (2006.01)

(56) References Cited

U.S. PATENT DOCUMENTS

| 5,871,591 | A  | 2/1999  | Ruby et al.       |
|-----------|----|---------|-------------------|
| 6,091,021 | A  | 7/2000  | Ruby et al.       |
| 6,274,514 | B1 | 8/2001  | Jang et al.       |
| 2004/0065362 | A1 | 4/2004 | Watabe et al.  |
| 2007/0261731 | A1 | 11/2007 | Abe et al.    |
| 2008/0202582 | A1 | 8/2008 | Noda           |
| 2008/0230119 | A1 | 9/2008 | Akimoto        |
| 2009/0301557 | A1 | 12/2009 | Agostinelli et al. |

FOREIGN PATENT DOCUMENTS

| JP | 2002-076404 A | 3/2002 |
| JP | 2004-247595 A | 9/2004 |
| JP | 2005-223080 A | 8/2005 |
| JP | 2008-109164 A | 8/2005 |
| KR | 1995-0003951 B1 | 12/1993 |
| WO | WO 2005/069356 A1 | 7/2005 |
| WO | WO 2006/027898 A1 | 3/2006 |

FIG. 4

| Condition | Jsc (mA/cm²) | Voc (V) | FF (%) | EF (%) |
|---|---|---|---|---|
| Wet etching | 34.34 | 0.629 | 79.35 | 17.13 |
| Surface texturing | 31.26 | 0.608 | 78.31 | 14.89 |
| Surface texturing and wet etching | 35.02 | 0.628 | 79.61 | 17.50 |

SOLAR CELL AND METHOD FOR MANUFACTURING THE SAME

This application is a Continuation of co-pending application Ser. No. 12/489,131 filed on Jun. 22, 2009, which claims priority to Application No. 10-2008-0085480 filed in Republic of Korea on Aug. 29, 2008. The entire contents of all of the above applications are hereby incorporated by reference.

BACKGROUND OF THE INVENTION

1. Field

Embodiments of the invention relate to a solar cell, and a method for manufacturing the solar cell.

2. Description of the Related Art

A solar cell converts energy of incident light into electrical energy through a photovoltaic effect. An amount of light generating the photovoltaic effect has to increase so as to increase a conversion efficiency of the solar cell. Namely, an amount of reflected light of the incident light has to decrease, and an amount of transmitted light of the incident light has to increase, in order to increase the conversion efficiency of the solar cell.

Further, to increase the conversion efficiency of the solar cell, a method of manufacturing the solar cell includes a texturing process on the surface of a wafer. The texturing process on the wafer surface includes roughing the wafer surface to reduce the amount of reflected light and increasing a scattering surface of light to increase the conversion efficiency of the solar cell.

However, the wafer surface may be damaged during the texturing process of the wafer surface. Because a surface damage of the wafer may be considered to be a defect of the solar cell, even if a large number of carriers are generated, a recombination of the carriers occurs in the defect of the wafer. Hence, a current of the solar cell decreases.

SUMMARY

Embodiments of the invention provide a method of manufacturing a solar cell capable of reducing a defect of a wafer generated in a texturing process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

In one aspect, there is a solar cell including a substrate having a surface on which jagged portions are non-uniformly positioned, the jagged portions having an inclination that is greater than 54.76° and less than 90°, and the substrate having a first type semiconductor and a second type semiconductor; a first electrode to contact the first type semiconductor; and a second electrode to contact the second type semiconductor.

In another aspect, there is a method for manufacturing a solar cell, the method including: forming jagged portions non-uniformly on a surface of a substrate, wherein the jagged portions have an inclination that is greater than 54.76 and less than 90°; forming a first type semiconductor and a second type semiconductor in the substrate; forming a first electrode to contact the first type semiconductor; and forming a second electrode to contact the second type semiconductor.

In another aspect, there is a method for manufacturing a solar cell, the method comprising: texturing a surface of a substrate of the solar cell using dry etching; wet etching the surface of the substrate to reduce a damage to the surface caused by the texturing; forming at least one anti-reflective layer on the textured surface of the substrate; and forming a first electrode and a second electrode on the substrate.

It is to be understood that both the foregoing general description and the following detailed description are examples and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description, serve to explain the principles of the invention. In the drawings:

FIG. 4 is a table illustrating a conversion efficiency of solar cells.

DETAILED DESCRIPTION OF THE EMBODIMENTS

Reference will now be made in detail to example embodiments of the invention examples of which are illustrated in the accompanying drawings.

FIGS. 1A to 1I illustrate a method of manufacturing a solar cell according to an embodiment of the invention.

Figure 1A:
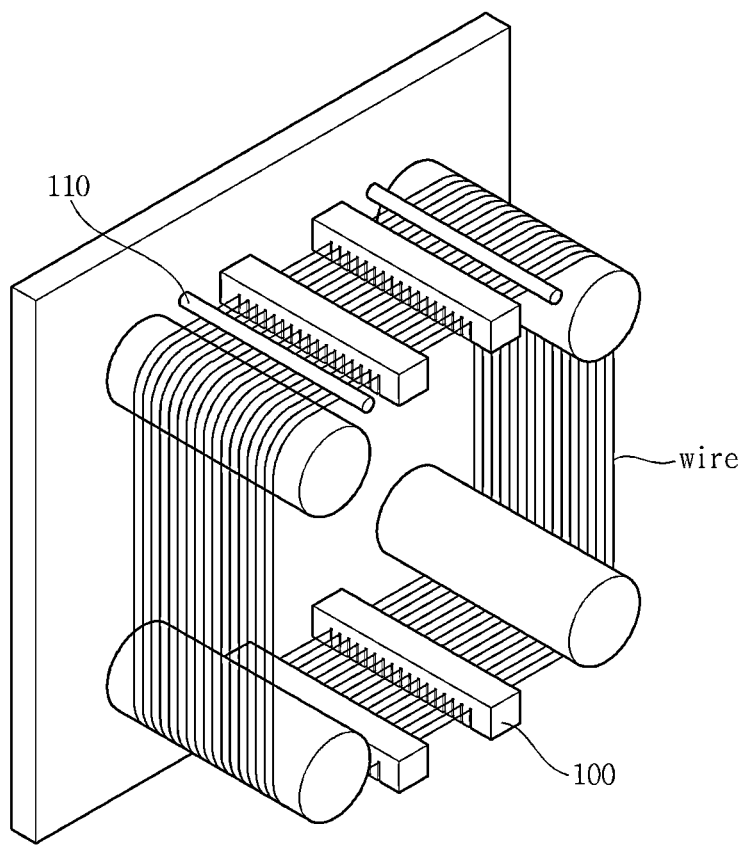
FIGS. 1A to 1I illustrate a method of manufacturing a solar cell according to an embodiment of the invention.

A sawing (or cutting) process is performed on a silicon ingot 100 to form a thin wafer. In the embodiment as shown in FIG. 1A, the sawing process is performed using wires. The sawing process using the wires includes making fine cracks in the silicon ingot 100 using a polishing agent through a tension generated by the wires to wear down or slice the silicon ingot 100. Hence, a wafer is formed. The polishing agent is supplied to the wires using a polishing agent manifold 110. Green carborundum (GC) may be used as the polishing agent. Embodiments of the invention include wafers that are polycrystalline, single crystalline or amorphous.

The sawing process may be performed for the wafer according the embodiments of the invention, or subsequent processes according to the embodiments of the invention may be performed on a wafer that has already undergone the sawing process.

After the sawing process is completed, a surface damage of the wafer that is likely to occur during the sawing process is removed through an additional process such as wet etching. The silicon ingot 100 undergoing the sawing process may be single crystal silicon having a diameter of 125 mm.

Figure 1B:
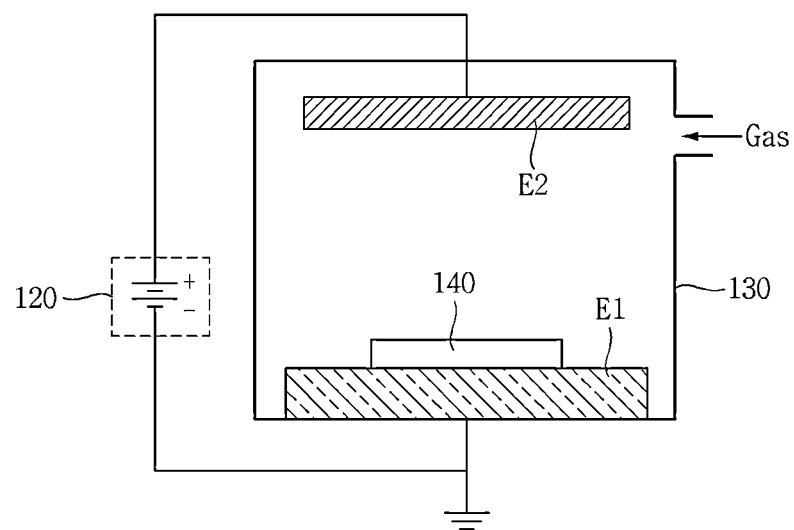

As shown in FIG. 1B, a texturing process using plasma without a mask (also referred to as dry etching) may be performed on the surface of a wafer 140 sliced from the silicon ingot 100 so as to reduce (or to further reduce) a reflectance of incident light. Namely, when an external power 120 supplies a voltage equal to or greater than a threshold voltage of gas ionization to electrodes E1 and E2 positioned at both (or respective) sides of a chamber 130, radicals and/or ions inside the chamber 130 are accelerated by an electric field generated by the voltage and collide with the surface of the wafer 140. Hence, convex portions (jagged portions or jagged peaks) 141a and concave portions (valleys) 141b are formed on the surface of the wafer 140, and thus the surface of the wafer 140 is textured.

The convex portions 141a, also referred to as jagged portions or jagged peaks, and concave portions 141b, also referred to as valleys, are shaped and distributed variously over the surface of the wafer 140. For example, the jagged portions 141a may individually appear wedge-shaped and/or have a sharp tip. The sides of the jagged portions 141a may be uneven, though some portions may be smooth. Like a wedge, the jagged portions 141a may be thin, but jagged portions 141a being pyramidal, or being shapes other than wedge-shaped, are within the scope of the invention. If other shapes, such shapes may have rounded or blunt tips. Thus, the jagged portions 141a having asymmetric, symmetric, or a combination of symmetric and asymmetric shapes are all within the scope of the invention.

A plurality of the jagged portions 141a, for example, may be distributed over the surface of the wafer 140, either densely or sparsely. If formed densely, the jagged portions 141a may make the surface of the wafer appear uneven. Such densely formed jagged portions 141a may be formed randomly and irregularly, but such is not required. Regularly formed jagged portions 141a are also within the scope of the invention. The densely formed jagged portions 141a may be connected, for example, at their bases, one after another.

Additionally, the jagged portions 141a may be formed sparely on the surface of the wafer 140. Such sparsely formed jagged portions 141a may be formed randomly and irregularly, but such is not required. Thus, sparsely formed jagged portions 141a that are positioned regularly on the surface of the wafer 140 are also within the scope of the invention. If sparsely formed, the jagged portions 141a may appear like islands on the surface of the wafer 140. Also, if the jagged portions 141a are sparsely formed, the wafer 140 may contain hollows, or may even be porous, for example, towards the surface of the wafer 140. However, the wafer 140 containing hollows, being porous and/or having islands of jagged portions 141a are not characteristics exclusive to the surface of the wafer 140 having sparsely formed jagged portions 141a. Rather, such hollows, being porous and/or having islands may also occur when the jagged portions 141a are densely formed. In embodiments of the invention, a surface of the wafer 140 may have all or some combination of the above noted characteristics of the jagged portions.

Figure 1C:
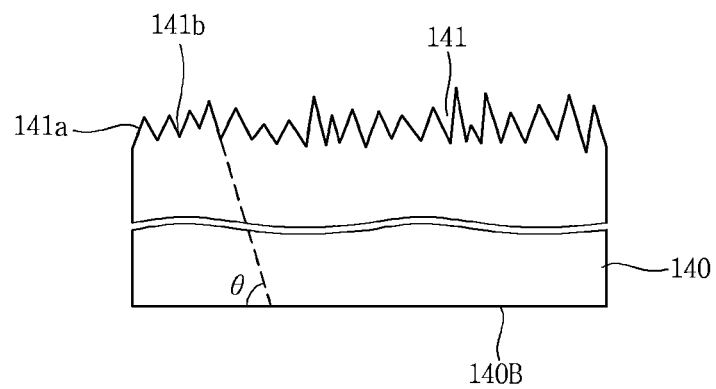

As shown in FIG. 1C, an angle θ between the side of the convex portion 141a or the concave portion 141b and a bottom 140B of the wafer 140 may be greater than about 54.76°. Additionally, the angle θ line may be based on a line extending horizontally along a side of the wafer 140 that is opposite from the side having the convex portion 141a or the concave portion 141b. The 54.76° is an angle between the side of the convex portion 141a or the concave portion 141b and the bottom 140B of the wafer 140 after a texturing process is performed using an anisotropic wet etching instead of the texturing process using plasma shown in FIG. 1B. Additionally, the 54.76° may be based on a base line extending between a peak of the convex portion 141a or the concave portion 141b and the bottom 140B (or the horizontal line) of the wafer 140. In embodiments of the invention, the jagged portions 141a have an inclination that is greater than 54.76° and less than 90°. Also, the inclination may also be referred to as a slope or a tilt. Because the texturing process using plasma is performed by collision of the radicals and/or the ions accelerated by the electric field, an angle formed on the textured surface of the wafer 140 after the texturing process using plasma is greater than the angle θ after the texturing process using the anisotropic wet etching.

Because the texturing process using plasma is performed without the mask, locations, heights, or depths of the convex portions 141a and locations, heights, or depths of the concave portions 141b may be nonuniform. The texturing of the wafer surface without the mask may reduce time and cost required to manufacture the solar cell.

As shown in FIG. 1C, after the texturing process of the wafer surface by the dry etching is completed, grooves 141 are generated in the surface of the wafer 140 and a scattering surface increases by the grooves 141. Hence, reflection of light decreases since the light is not incident on a flat surface. Rather, some light that may be reflected off a side of one convex portion 141a is reflected towards a side of an adjacent convex portion 141a and enters the wafer 140 through the adjacent convex portion 141a.

Figure 2:
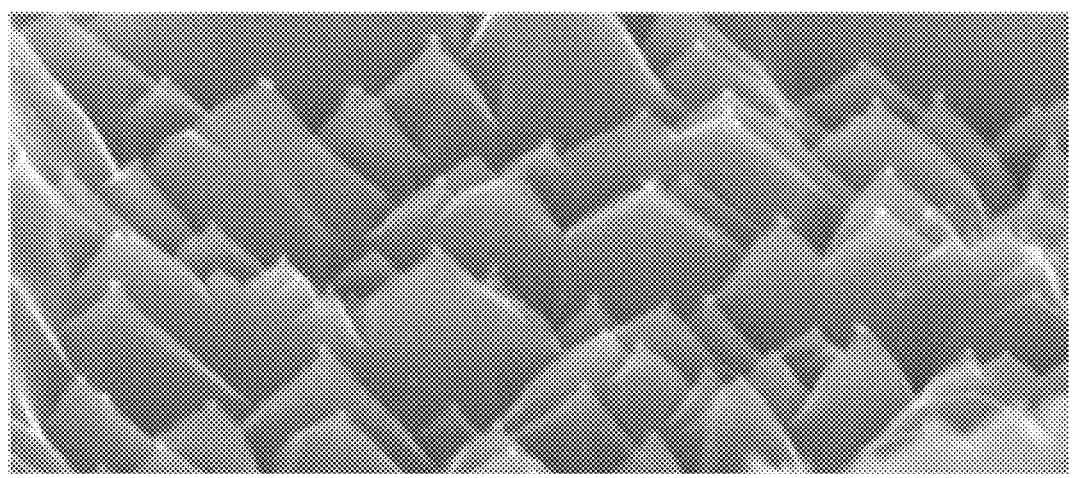
FIG. 2 is a photograph of a wafer surface taken through an electron microscope after a texturing process using plasma is performed.

A surface damage of the wafer 140 occurs during the texturing process using plasma. FIG. 2 is a photograph of a wafer surface taken through an electron microscope after the texturing process using plasma.

Figure 1D:
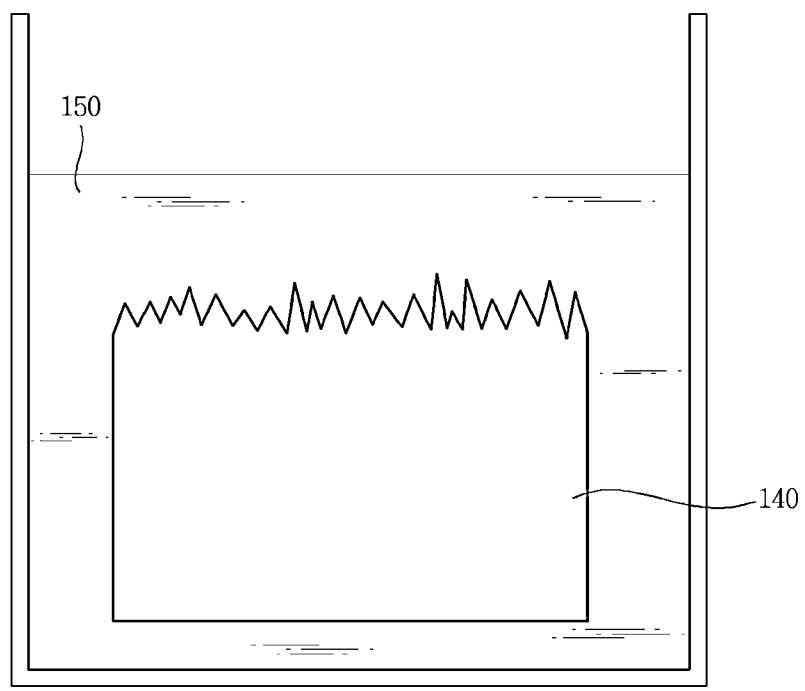

As shown in FIG. 1D, the wafer 140 undergoing the texturing process by the dry etching is exposed to an acid etchant 150 having a small etch rate so as to remove the surface damage of the wafer 140, which occurred during the texturing process by the dry etching. Because the acid etchant 150 is used to remove only the surface damage of the wafer 140, the acid etchant 150 has to have the small etch rate so as to easily control an etching amount of the acid etchant 150. However, if the etch rate of the acid etchant 150 is too small, a stain may appear in the surface of the wafer 140. Therefore, the etch rate of the acid etchant 150 is made proper, and not too small. The stain is a thin layer of amorphous silicon generated when the etching is performed using the acid etchant with too small an etch rate. To control the etch rate of the acid etchant 150 to be proper, the acid etchant 150 contains about 0.5 wt % to about 10 wt % of HF, about 30 wt % to about 60 wt % of $HNO_3$, and up to about 30 wt % of acetic acid based on total weight of the acid etchant 150, which may include water.

When an amount of HF is less than about 0.5 wt %, the etch rate of the acid etchant 150 is very small. When an amount of HF is greater than about 10 wt %, the grooves 141 as well as the surface damage of the wafer 140 may be removed because of the very large etch rate of the acid etchant 150. When an amount of $HNO_3$ is less than about 30 wt %, etching uniformity may worsen. When an amount of $HNO_3$ is greater than about 60 wt %, the etch rate of the acid etchant 150 is very large. When an amount of acetic acid is greater than about 40 wt %, the etch rate of the acid etchant 150 is very large.

In embodiments of the invention, the etch rate of the acid etchant 150 is more directly dependent on an amount of HF. Thus, generally, the etch rate is increased by an increase in the amount of HF in the acid etchant 150, and is decreased by a decrease in the amount of HF. Additionally, acetic acid may be replaced with water as a diluent, although the acetic acid is used to control increase of the etch rate of the acid etchant 150. In embodiments of the invention, HF and $HNO_3$ are used as the dominant acids to determine or obtain the etch rate of the acid etchant 150.

Figure 3:
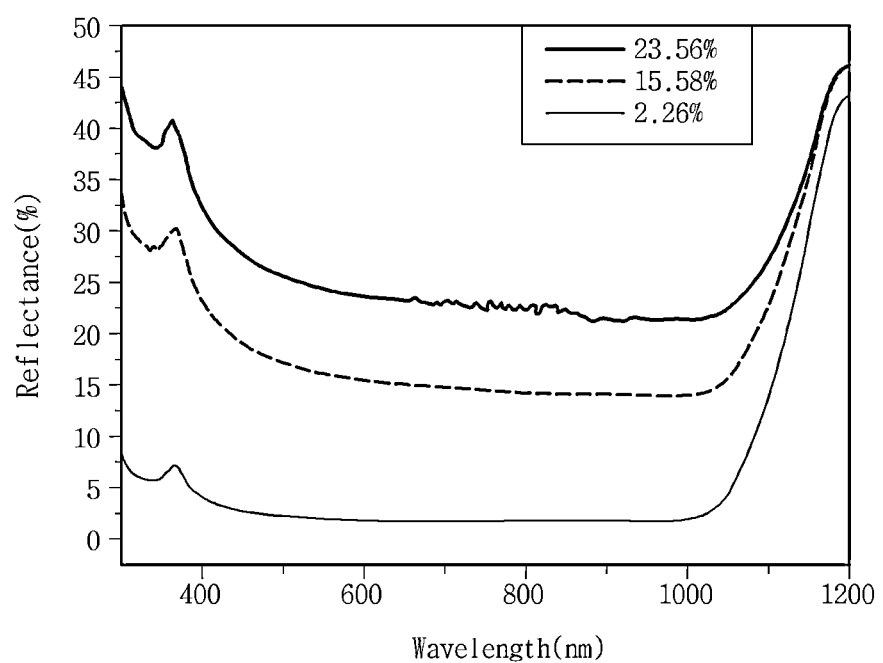
FIG. 3 is a graph illustrating a reflectance with respect to a wavelength of solar cells.

FIG. 3 is a graph illustrating a reflectance with respect to a wavelength of solar cells. In FIG. 3, a bold solid line (top line) indicates a reflectance with respect to a wavelength of light when the wet etching process was performed on the wafer surface that underwent the sawing process without the texturing of the wafer surface by plasma (dry etching process). A thin solid line (bottom line) indicates a reflectance with respect to a wavelength of light when only the texturing process by plasma (dry etching process) was performed on the wafer surface. A dotted line (middle line) indicates a reflectance with respect to a wavelength of light when the texturing process by plasma (dry etching process) and the wet etching process using the acid etchant 150 were performed.

In particular, the acid etchant 150 may contain about 0.5 wt % to about 10 wt % of HF, about 30 wt % to about 60 wt % of $HNO_3$, and up to about 30 wt % of acetic acid based on total weight of the acid etchant 150.

In the graph of FIG. 3, a percentage value within a box in an upper portion of the graph indicates an average weighted reflectance (AWR) of wafers subjected to the etching etching process, the dry etching process, or both. A reflectance measuring device (for example, solid spec 3700) was used to measure the reflectance.

As shown in FIG. 3, the AWR of about 15.58%, obtained when the surface damage generated in the texturing process by plasma was removed using the wet etching process (i.e., the middle line), is smaller than the AWR of 23.56%, obtained when the etching process was performed without the texturing process by plasma of the wafer surface (i.e., the top line), by about 8%. Namely, an AWR gain of about 8% was obtained when both the dry and wet etchings were performed on the wafer surface.

When the wet etching process using the acid etchant is performed after the texturing process by plasma, the problem of surface passivation may occur because of the large surface area. In the embodiment of the invention, as shown in FIG. 1F, a plurality of anti-reflective layers 160 and 170 are formed to maximize a surface passivation effect.

FIG. 4 is a table illustrating a conversion efficiency of solar cells. In FIG. 4, Jsc indicates a density of short-circuit current of a solar cell, Voc indicates an open-circuit voltage of the solar cell, FF indicates a fill factor, and EF indicates a conversion efficiency of the solar cell. It can be seen from FIG. 4 that a conversion efficiency when the wet etching process using the acid etchant is performed after the texturing process by plasma as in the embodiment of the invention is greater than a conversion efficiency when only the wet etching process is performed on the wafer surface underwent the sawing process without the texturing process by plasma of the wafer surface, or a conversion efficiency when only the texturing process by plasma is performed.

In other words, when the wet etching process using the acid etchant is performed after the texturing process by plasma (dry etching) is performed, as in the embodiment of the invention, the surface damage of the wafer generated in the surface texturing process using plasma is removed. Hence, a recombination of carriers decreases, and the conversion efficiency of the solar cell increases.

In embodiments of the invention, the removal of the surface damage of the surface texturing process using plasma may be determined by an increase or a same value of the Jsc and/or the Voc. Likewise, persistence of the surface damage may be determined by a decrease in the value of the Jsc and/or the Voc.

With reference to FIGS. 3 and 4, a wafer that was subjected to both the wet etching process and the surface texturing process using plasma has a larger reflectance than a wafer that was subjected to only the surface texturing process using plasma. However, by additionally performing the wet etching process, damage caused by plasma that acts as defect to facilitate recombination of carrier are reduce in the wafer, so that the wafer that was subjected to both the wet etching process and the surface texturing process using plasma has similar or larger density of short-circuit current (Jsc), open-circuit voltage (Voc), fill factor (FF), and conversion efficiency (EF) than those of the wafer that was subjected to only the surface texturing process using plasma. Accordingly, an increase in the reflectance is compensated by an increase in conversion efficiency, for example.

Subsequent to the dry and wet etching processes, cleaning processes are performed, such as HCl cleaning and/or HF cleaning. During the HCl cleaning, hydrochloric acid (HCl) and hydrogen peroxide ($H_2O_2$) are used to clean metal impurities that may form on the surface of the wafer due the various etching processes. During the HF cleaning, an oxide layer is removed using the hydrofluoric acid (HF).

Figure 1E:
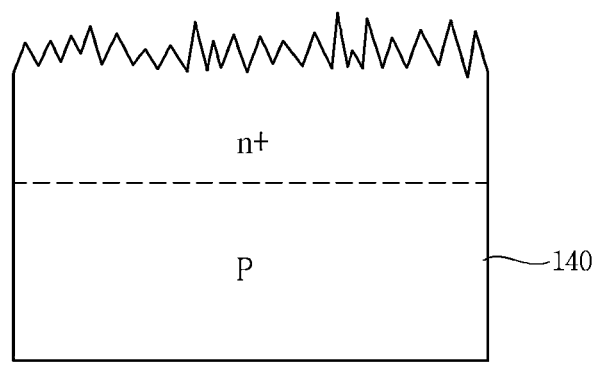
Figure 1F:
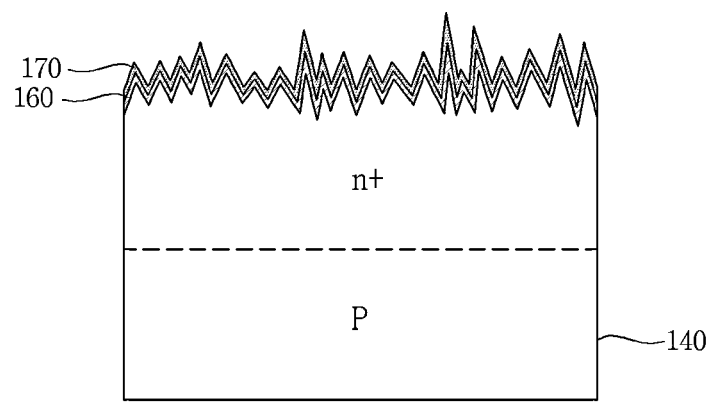

As shown in FIG. 1E, an impurity doping process is performed to form a pn junction in the wafer 140. More specifically, the surface of the wafer 140 is exposed to a gas or a solid of a group III element doped with p-type impurities or a group V element doped with n-type impurities at a high temperature and thus is doped with the p-type or n-type impurities. $PH_3$, $POCL_3$, BN, etc. may be used as a source of impurities. The inside of the wafer 140 may be doped with impurities belonging to the group III or V elements through ion injection. More specifically, the wafer 140 may be positioned inside a vacuum chamber, and impurities of the group III or V element may be injected into the surface of the wafer 140 by accelerating the impurity ions.

As shown in FIG. 1F, the plurality of anti-reflective layers 160 and 170 are formed so as to reduce or prevent a reflection of incident light. The first anti-reflective layer 160 is formed on the textured surface of the wafer 140, and the second anti-reflective layer 170 is formed on the first anti-reflective layer 160. Because light reflected from the second anti-reflective layer 170 and light reflected from the first anti-reflective layer 160 generate a destructive interference, a reflection of light decreases, and selectivity at a predetermined wavelength of light increases. For this, a refractive index of the first anti-reflective layer 160 is greater than a refractive index of the second anti-reflective layer 170, or vice versa. The first and second anti-reflective layers 160 and 170 may be formed using a vacuum deposition method, a chemical vapor deposition method, a spin coating method, a screen printing method, or a spray coating method.

Figure 1G:
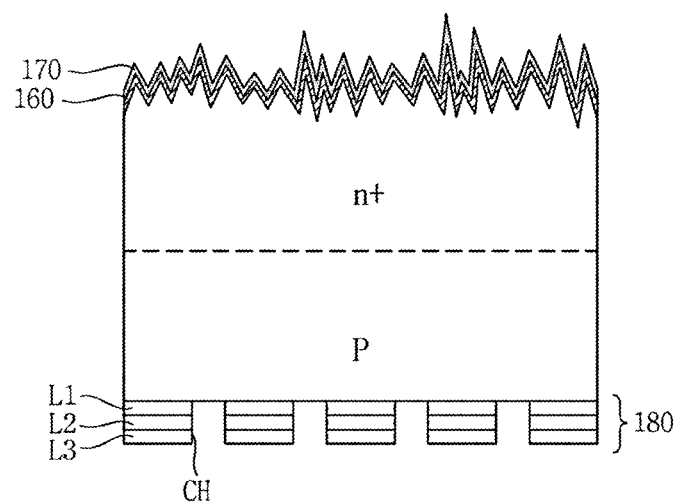

As shown in FIG. 1G, a reflective layer 180 including a plurality of reflective layers L1, L2, and L3 is formed on another surface of the wafer 140 using a deposition method such as a chemical vapor deposition method. A plurality of contact holes CH to be filled with a second electrode, which will be formed in a subsequent process, are formed in the reflective layer 180. As the reflective layer 180, a SiOx layer L1, a SiOxNy layer L2, and a SiOx:H layer L3 may be formed on the wafer 140 in turn. The H in the SiOx:H layer L3 refers to hydrogen that is included with the SiOx.

Figure 1H:
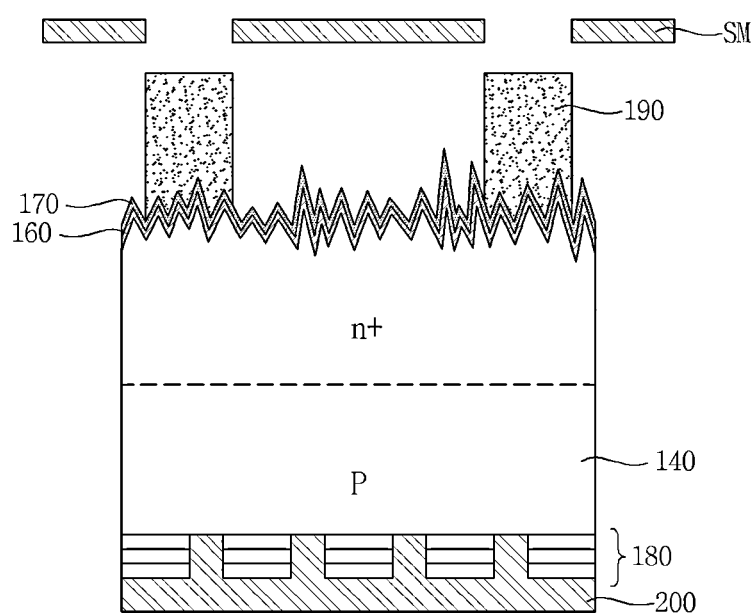

As shown in FIG. 1H, a first electrode paste 190 is squeezed through a screen mask SM using a squeezer (not shown) to form a pattern of a plurality of first electrodes on the second anti-reflective layer 170. The first electrode paste 190 may include Ag, etc. A second electrode paste 200 is injected into the contact holes CH of the reflective layer 180 using a screen printing method to form a pattern of the second electrode. The second electrode paste 200 may include aluminum (Al), etc.

Figure 1I:
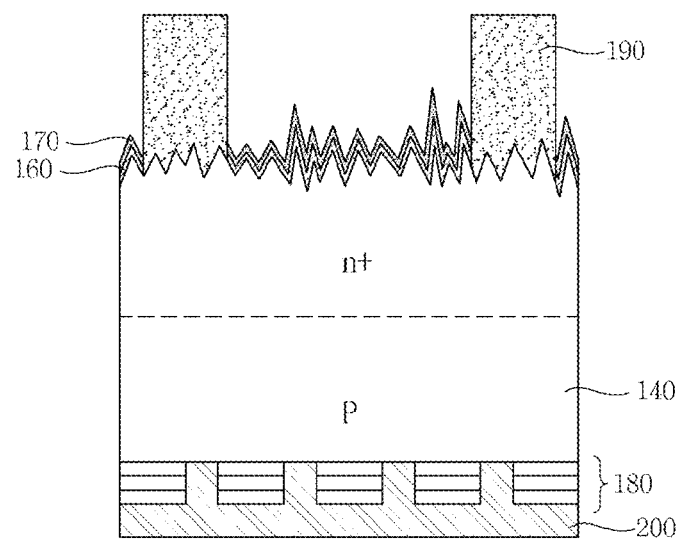

Subsequently, a firing process is performed on the first electrode paste 190 having the pattern of the first electrodes, the first anti-reflective layer 160, the second anti-reflective layer 170, the reflective layer 180, and the second electrode paste 200 having the pattern of the second electrode. Namely, the first electrode paste 190, the first anti-reflective layer 160, the second anti-reflective layer 170, the reflective layer 180, and the second electrode paste 200 are fired (heated) by performing the firing process once. When the firing process is performed, the first electrode paste 190 passes through the first and second anti-reflective layers 160 and 170 and contacts the wafer 140. When the firing process is completed, as shown in FIG. 1I, the first electrode paste 190 passes through the first and second anti-reflective layers 160 and 170 and contacts one surface of the wafer 140, to form the plurality of first electrodes.

When the firing process is completed, the first electrodes contact a first type semiconductor, and the second electrode contacts a second type semiconductor different from the first type semiconductor. In the embodiment, the first electrodes contact an n-type semiconductor or an emitter, and the second electrode contacts a p-type semiconductor or a substrate.

In embodiments of the invention, references to wafer include a substrate and a solar cell. That is, discussions of the wafer are applicable to a substrate having n- and p-type semiconductors, and a solar cell fabricated using the wafer and/or the substrate.

Although embodiments of the invention have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell, comprising:
   a substrate having a first surface on which jagged portions are non-uniformly positioned, the jagged portions having an inclination that is greater than 54.76° and less than 90°, and the substrate having a first type semiconductor and a second type semiconductor;
   a first anti-reflective layer on the first surface of the substrate, the first anti-reflective layer having a first refractive index;
   a second anti-reflective layer on the first anti-reflective layer, the second anti-reflective layer having a second refractive index different from the first refractive index;
   at least one reflective layer positioned on a second surface of the substrate opposite the first surface;
   a first electrode to contact the first type semiconductor; and
   a second electrode to contact the second type semiconductor through the at least one reflective layer;
   wherein the at least one reflective layer includes a first reflective layer having a first refractive index, a second reflective layer having a second refractive index smaller than the first refractive index, and a third reflective layer disposed between the second surface of the substrate and the first reflective layer,
   wherein the first reflective layer is disposed closer to the second surface of the substrate than the second reflective layer,
   wherein the first reflective layer is disposed between the third reflective layer and the second reflective layer,
   wherein the third reflective layer is disposed on the second surface of the substrate, the first reflective layer is disposed on the third reflective layer, and the second reflective layer is disposed on the first reflective layer, and
   wherein the first reflective layer is formed of a silicon oxynitride layer, the second reflective layer is formed of a hydrogenated silicon oxide layer and the third reflective layer is formed of a silicon oxide layer.

2. The solar cell of claim 1, wherein the first refractive index of the first anti-reflective layer is greater than the second refractive index of the second anti-reflective layer.

3. The solar cell of claim 1, wherein the third reflective layer has a third refractive index greater than the first refractive index of the first anti-reflective layer.

4. A method for manufacturing a solar cell, the method comprising:
   forming jagged portions non-uniformly on a first surface of a substrate, wherein the jagged portions have an inclination that is greater than 54.76° and less than 90°;
   forming a first type semiconductor and a second type semiconductor in the substrate;
   forming a first anti-reflective layer on the first surface of the substrate and a second anti-reflective layer on the first anti-reflective layer, a refractive index of the first anti-reflective layer being different from a refractive index of the second anti-reflective layer;
   forming at least one reflective layer on a second surface of the substrate opposite the first surface;
   forming a first electrode to contact the first type semiconductor; and
   forming a second electrode to contact the second type semiconductor through the at least one reflective layer,
   wherein the at least one reflective layer includes a first reflective layer having a first refractive index, a second reflective layer having a second refractive index smaller than the first refractive index, and a third reflective layer disposed between the second surface of the substrate and the first reflective layer,
   wherein the first reflective layer is disposed closer to the second surface of the substrate than the second reflective layer,
   wherein the first reflective layer is disposed between the third reflective layer and the second reflective layer,
   wherein the third reflective layer is disposed on the second surface of the substrate, the first reflective layer is disposed on the third reflective layer, and the second reflective layer is disposed on the first reflective layer, and
   wherein the first reflective layer is formed of a silicon oxynitride layer, the second reflective layer is formed of a hydrogenated silicon oxide layer and the third reflective layer is formed of a silicon oxide layer.

5. The method of claim 4, further comprising, after forming the jagged portions, wet etching the first surface of the substrate.

6. The method of claim 5, wherein an etchant used in the wet etching contains about 0.5 wt % to 10 wt % of HF, about 30 wt % to 60 wt % of $HNO_3$, and up to about 30 wt % of acetic acid based on total weight of the etchant.

7. The method of claim 4, wherein the forming of the jagged portions includes using plasma ions and/or radicals to texture the surface of the substrate.

8. The method of claim 4, wherein the third reflective layer has a third refractive index greater than the first refractive index of the first anti-reflective layer.

9. The method of claim 4, further comprising, before forming the jagged portions, wet etching the substrate.

* * * * *